US006888171B2

(12) United States Patent
Liu et al.

(10) Patent No.: US 6,888,171 B2
(45) Date of Patent: May 3, 2005

(54) LIGHT EMITTING DIODE

(75) Inventors: Heng Liu, Los Angeles, CA (US); Changhua Chen, Los Angeles, CA (US)

(73) Assignee: Dalian Luming Science & Technology Group Co., Ltd., Dalian (CN)

(*) Notice: Subject to any disclaimer, the term of this patent is extended or adjusted under 35 U.S.C. 154(b) by 0 days.

(21) Appl. No.: 09/748,801

(22) Filed: Dec. 22, 2000

(65) Prior Publication Data

US 2002/0079500 A1 Jun. 27, 2002

(51) Int. Cl.$^7$ .......................... H01L 27/15; H01L 29/12; H01L 29/40
(52) U.S. Cl. ............... 257/99; 257/79; 257/613; 257/615; 257/612; 257/624; 257/626
(58) Field of Search ........................... 257/79, 99, 613, 257/615, 622, 624, 626

(56) References Cited

U.S. PATENT DOCUMENTS

| | | | | |
|---|---|---|---|---|
| 5,281,829 A | * | 1/1994 | Chinen | 257/80 |
| RE36,747 E | * | 6/2000 | Manabe et al. | 257/431 |
| 6,121,638 A | * | 9/2000 | Rennie et al. | 257/103 |
| 6,180,960 B1 | * | 1/2001 | Kusuda et al. | 257/91 |
| 6,204,512 B1 | * | 3/2001 | Nakamura et al. | 257/13 |
| 6,281,524 B1 | * | 8/2001 | Yamamoto et al. | 257/99 |
| 6,287,947 B1 | * | 9/2001 | Ludowise et al. | 438/606 |
| 2002/0074553 A1 | * | 6/2002 | Starikov et al. | 257/77 |
| 2003/0010994 A1 | * | 1/2003 | Chen et al. | 257/99 |

* cited by examiner

Primary Examiner—Allan R. Wilson
Assistant Examiner—Joseph Nguyen
(74) Attorney, Agent, or Firm—Jean C. Edwards, Esq.; Dickinson Wright, PLLC

(57) ABSTRACT

A semi-conductor light emitting diode includes closely spaced n and p electrodes formed on the same side of a substrate to form an LED with a small foot-print. A semi-transparent U shaped p contact layer is formed along three sides of the top surface of the underlying window layer. The p electrode is formed on the p contact layer centered on the closed end of the U shaped layer. An n contact layer is formed on an n cladding layer and centered in the open end of the U of the p contact layer. The n electrode is formed on the n contact layer. The n and p electrodes are electrically isolated from one another by either a trench or an insulator, situated between the electrodes.

15 Claims, 1 Drawing Sheet

LIGHT EMITTING DIODE

The present invention relates to light emitting diodes which have metal contacts on the same side of a substrate.

BACKGROUND OF THE INVENTION

Although the structures of light emitting diodes (LED's) and the manufacturing processes for making those structures have matured through the years, there remain technical and economic challenges to the industry. Because of the high costs of substrates and growth processes, it is essential to the success of the manufacturing processes, that the footprint of each device be kept as small as possible that is consistent with the target light output requirements.

A particular challenge to reduction of the footprint exists in the case of LED's which employ insulating substrates and metal contacts which are situated on the same side of the substrate. In such structures, there is a tendency for current flowing between the metal contacts to concentrate in a small, lower impedance, preferred path through the light emitting surface. Consequently, much of the light emitting surface is not activated. To date this problem has been addressed by the provision of conductive, semi-transparent, window contact layers and by maintaining physical lateral separation of the contacts. Such separation seriously limits the number of devices that can be constructed on a substrate of any given size; and thus is an economic burden to the manufacturer.

SUMMARY OF THE INVENTION

A light emitting diode, in accordance with one embodiment consistent with the present invention, includes a complementary pair of electrodes and a mechanism for isolating their corresponding metal contacts, to force current flowing between the contacts to flow more fully throughout the active layer.

Advantageously, these measures increase the light output efficiency of the device; and permit a higher density of devices on a substrate of any given size.

DETAILED DESCRIPTION OF THE PREFERRED EMBODIMENTS

Figure 1:
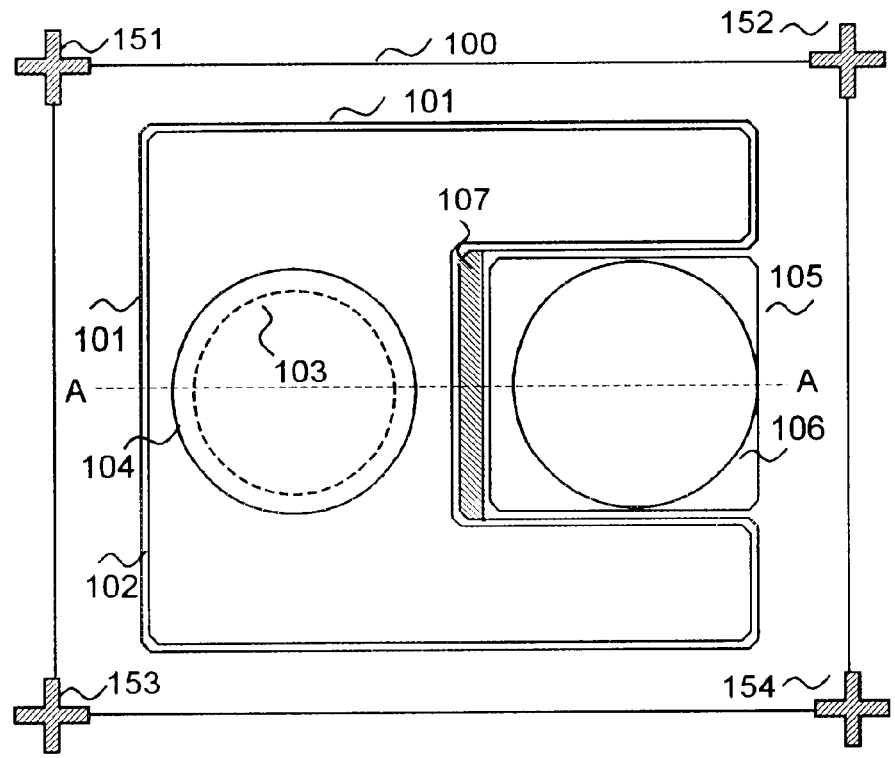
FIG. 1 is a schematic top view of an LED in accordance with one embodiment consistent with the present invention.
Figure 2:
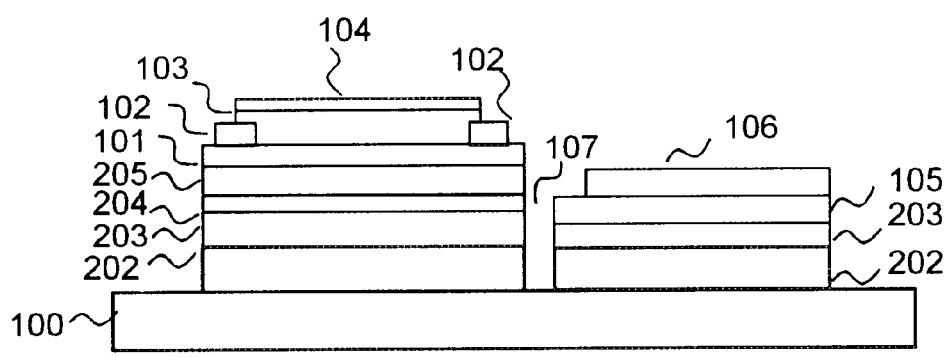
FIG. 2 is schematic side view of the LED of FIG. 1 taken along line A—A.

For purposes of illustration, an LED depicted in FIGS. 1 and 2 is a gallium nitride (GaN) based structure formed on an insulating substrate. The device of FIG. 1 is surrounded by four plus symbols, i.e., reference numerals 151 through 154, and by a boundary line of the substrate 100 to demonstrate an illustrative footprint of a device on the substrate. The devices of FIG. 1, as formed on substrate 100, are separated by "streets" which have been formed by etching. Separation of the devices is nominally along the center lines of the streets.

In FIGS. 1 and 2, the same reference numerals depict the same elements. The features of FIG. 2, which are not illustrated in FIG. 1, are identified with reference numerals starting at 202.

The illustrative GaN device consistent with one embodiment of the present invention, and as shown in FIGS. 1 and 2, is formed on a sapphire substrate 100. FIG. 2 illustrates the components of the LED as seen at the section line A—A of FIG. 1. The LED of FIGS. 1 and 2 includes a sapphire substrate 100; a buffer region 202 for overcoming the lattice mismatch between the sapphire substrate and GaN layers; an n cladding layer 203; an active region 204; a p cladding layer 205; a p window region 101; a p contact layer 102; a p metal contact 103, 104; an n contact region 105; and an n metal contact 106. The p contact layer 102 along with the p metal contact 103, 104 forms an ohmic contact with the p window region 101. The n contact region 105 along with n metal contact 106 forms an ohmic contact with the n cladding layer 203.

The elements of the LED which are labeled 101 and 202 through 205, are formed by MOCVD processes. The elements which are labeled 102 through 106 are formed by evaporation. After completion of the MOCVD processing, etching which is controlled by photolithography, exposes the portion of the n cladding layer on which the n contact assembly 105, 106 is to be formed. A subsequent deep etching step, again under control by photolithography, opens the "streets" between the individual devices. At the same time, the deep isolation trench 107 can be formed. If isolation between the metal contacts is to be provided by an insulator formed by ion implantation, etching of the deep isolation trench is omitted.

In the illustrative embodiment of FIG. 1 which is consistent with one embodiment of the present invention, p window region 101 includes: (a) a first window layer which is formed of GaN doped with magnesium (Mg); and (b) an overlying second GaN window layer which is more highly doped Mg+. As seen in FIG. 1, the layers of the p window region 101 embrace the entire footprint of the device other than: (a) the surface area defined by circle 103; (b) the surface area defined by rectangle 105; and (c) the surface area of the trench or ditch 107.

Contact layer 102 is a thin, semi-transparent, conductive layer of $NiO_x$/Au which is deposited over the exposed face of the top layer of region 101. A first opening therein, identified as 103 in FIG. 1, is etched through layer 102 to reach the highly doped layer of window region 101. A Ti metal contact 103 is formed as shown in FIG. 2 to provide adhesion to the exposed surface of window region 101 and to layer 102. Gold contact layer 104 is deposited over the Ti metal contact 103. $NiO_x$/Au layer 102 and Ti metal contact 103 form an ohmic contact with layer 101.

The n contact region 105 is formed of a number of layers of metals including Ti, Ni, and Al to provide adhesion to n cladding layer 203 and to provide an ohmic contact foundation for the deposit of Au contact 106.

Contact layer 102 tends to spread the current evenly over the underlying surface area of the active region 204. However, the shape and physical relation of the n contact to the remainder of the device, produces a physically small, relatively low impedance path which concentrates the current flowing between the contacts to a limited area of the active region 204.

Isolation of metal contacts 104 and 106 by a deep trench 107, or by a similarly located implanted insulator as an isolation means, formed through to the substrate as shown in FIG. 2, which eliminates the low impedance path between the contacts, and thus permits reduced lateral separation between contacts 104 and 106.

The "U" shape of semi-transparent conductive layer 102 provides a large light emitting surface; and the "U" shape, in cooperation with the n electrode which is centered in the open end of the "U", efficiently spreads the activation current throughout the active layer. The parallel legs of the U shape provide current paths around the isolation means 107, in both the p cladding layer 205 and the n cladding layer 203.

The invention has been described with particular attention to its preferred embodiment; however, it should be understood that variations and modifications within the spirit and scope of the invention may occur to those skilled in the art to which the invention pertains. For example the metal contacts can be situated either diagonally in opposing corners, or in adjacent corners, of the device, with insulation provided therebetween. Similarly, although the device foot print is a rectangle, a device with a square foot print can accommodate laterally spaced apart metal contacts which are isolated by a deep trench or by an insulator.

What is claimed is:

1. A semi-conductor light emitting diode structure comprising:
    a sapphire substrate;
    a GaN based light emitting structure;
    first and second electrodes laterally spaced apart on a same side of said substrate; and
    means formed in said diode structure for isolating said electrodes from one another;
    wherein said first electrode comprises a U shaped semi transparent conductive p contact layer; and a metal p contact centered on a closed end of the U shaped layer; and
    wherein said second electrode comprises an n contact layer and a metal n contact centered in an open end of the U shaped layer.

2. A semi-conductor light emitting diode structure in accordance with claim 1,
    wherein said isolating means comprises a trench situated between said electrodes.

3. A semi-conductor light emitting diode structure in accordance with claim 1,
    wherein said isolating means comprises an insulator situated between said electrodes.

4. A semi-conductor light emitting diode structure comprising:
    a substrate;
    first and second electrodes laterally spaced apart on a same side of said substrate; and
    means formed in said diode structure for isolating said electrodes from one another;
    wherein said first electrode comprises a U shaped semi transparent conductive p contact layer; and a metal p contact centered on a closed end of the U shaped layer; and
    wherein said second electrode comprises an n contact layer and a metal n contact centered in an open end of the U shaped layer.

5. A semi-conductor light emitting diode structure in accordance with claim 4,
    wherein said isolating means comprises a trench situated between said electrodes.

6. A semi-conductor light emitting diode structure in accordance with claim 4,
    wherein said isolating means comprises an insulator disposed between said electrodes.

7. A semiconductor light emitting diode structure comprising:
    a substrate;
    a first electrode formed on said substrate in a U shape;
    a second electrode formed on said substrate and spaced apart from said first electrode by an isolation trench, said second electrode being disposed in an open end of said U shape.

8. A semi-conductor light emitting diode in accordance with claim 1 or 4,
    wherein said p contact layer comprises a $NiO_x$/Au layer; and said metal p contact comprises a Ti layer and an Au layer;
    wherein said n contact layer comprises layers of Ti, Ni, and Al; and
    wherein said metal n contact comprises Au.

9. A semiconductor light emitting diode structure comprising:
    a substrate;
    first and second electrodes laterally spaced apart on a same side of said substrate; and
    an isolation mechanism formed in said diode structure which isolates said electrodes from one another;
    wherein said first electrode comprises:
        a U-shaped semi-transparent conductive p contact layer; and
        a metal p contact centered on a closed end of the U-shaped layer; and
    wherein said second electrode comprises:
        an n contact layer and a metal n contact centered in an open end of the U-shaped layer.

10. The semiconductor light emitting diode in accordance with claim 9,
    wherein said p contact layer comprises a $NiO_x$/Au layer;
    wherein said metal p contact comprises a Ti layer and an Au layer;
    wherein said n contact layer comprises layers of Ti, Ni, and Al; and
    wherein said metal n contact comprises Au.

11. The semiconductor light emitting diode in accordance with claim 9, wherein said substrate is a sapphire substrate.

12. The semiconductor light emitting diode in accordance with claim 9, wherein said isolation mechanism comprises a trench situated between said electrodes and formed through to said substrate.

13. The semiconductor light emitting diode in accordance with claim 9, wherein said isolation mechanism comprises an insulator situated between said electrodes and disposed adjacent said substrate.

14. The semiconductor light emitting diode in accordance with claim 9, wherein said first and second electrodes are arranged at different height levels above said substrate.

15. A semiconductor light emitting diode structure comprising:
    a substrate;
    a buffer region disposed on said substrate;
    an n cladding layer disposed on said buffer region;
    an active region disposed on said n cladding layer;
    a p cladding layer disposed on said active region;
    a p window region disposed on said p cladding region;
    a p contact region disposed on said p window region;
    a p contact layer and a p metal contact disposed on said p contact region, which forms an ohmic contact with the p window region;
    an n contact region disposed on said n cladding layer; and
    an n metal contact disposed on said n contact region, which forms an ohmic contact with the n cladding layer;
    wherein said n contact region and said n metal contact are isolated from said active region, said p cladding layer, said p window region, said p contact layer, and said p metal contact.

* * * * *

UNITED STATES PATENT AND TRADEMARK OFFICE
CERTIFICATE OF CORRECTION

PATENT NO. : 6,888,171 B2 Page 1 of 1
DATED : May 3, 2005
INVENTOR(S) : Heng Liu and Changhua Chen It is certified that error appears in the above-identified patent and that said Letters Patent is hereby corrected as shown below:

<u>Title page,</u>
Item [73], Assignee, "Dallan Luming Science and Technology Group Co., Ltd." to
-- Dalian Lurning Science and Technology Group Co., Ltd. --

Signed and Sealed this

Second Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,888,171 B2 Page 1 of 1
DATED : May 3, 2005
INVENTOR(S) : Heng Liu and Changhua Chen It is certified that error appears in the above-identified patent and that said Letters Patent is hereby corrected as shown below:

<u>Title page,</u>
Item [73], Assignee, "Dallan Luming Science and Technology Group Co., Ltd." to
-- Dalian Luming Science and Technology Group Co., Ltd. --.

This certificate supersedes Certificate of Correction issued August 2, 2005.

Signed and Sealed this

Fifteenth Day of November, 2005

JON W. DUDAS
*Director of the United States Patent and Trademark Office*